(12) United States Patent
Khoury et al.

(10) Patent No.: US 6,399,900 B1
(45) Date of Patent: *Jun. 4, 2002

(54) CONTACT STRUCTURE FORMED OVER A GROOVE

(75) Inventors: Theodore A. Khoury; James W. Frame, both of Chicago, IL (US)

(73) Assignee: Advantest Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,475

(22) Filed: Apr. 30, 1999

(51) Int. Cl.[7] .................................................. H01R 9/09
(52) U.S. Cl. ..................... 174/267; 174/260; 361/774
(58) Field of Search ................................. 174/260, 267; 361/772, 773, 774, 776; 257/692

(56) References Cited

U.S. PATENT DOCUMENTS

| | | | | |
|---|---|---|---|---|
| 2,869,040 A | * | 1/1959 | Pifer | ........................... 174/261 |
| 4,893,172 A | * | 1/1990 | Matsumoto et al. | |
| 5,139,427 A | * | 8/1992 | Boyd et al. | ..................... 439/66 |
| 5,166,774 A | * | 11/1992 | Banerji et al. | |
| 5,228,861 A | * | 7/1993 | Grabbe | ........................ 439/66 |

* cited by examiner

Primary Examiner—Kamand Cuneo
(74) Attorney, Agent, or Firm—Muramatsu & Associates

(57) ABSTRACT

A contact structure for achieving an electrical connection with a contact target is formed by producing a contactor on a planar surface of a substrate by a microfabrication technology. The contact structure is comprised of a substrate having a planar surface, a groove formed on the substrate lower than the planar surface, and a contactor formed on the substrate. The contactor includes a horizontal portion which is a substantially straight beam with a fixed and a free end, and a contact portion mounted on the free end of the horizontal portion in a direction perpendicular to the horizontal portion. The fixed end is connected to the substrate and the free end is positioned over the groove on the substrate. The groove provides a free space for the contactor when it is pressed against the contact target such that the free end of the horizontal beam enters the groove.

10 Claims, 13 Drawing Sheets

Fig. 3 (Prior Art)
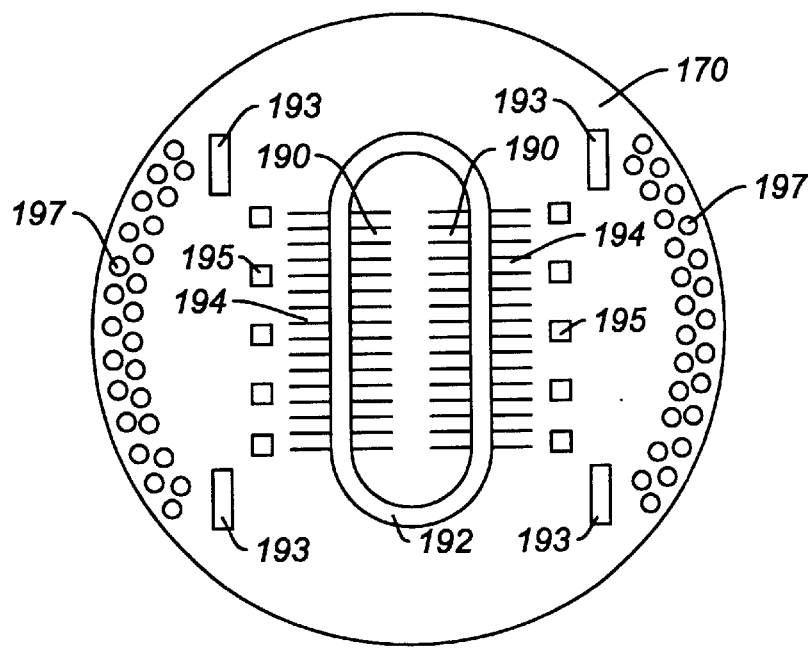
(Prior Art)
Fig. 4A
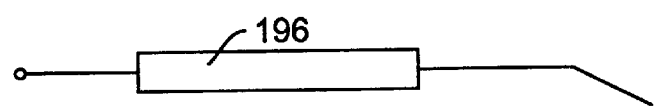
Fig. 4B
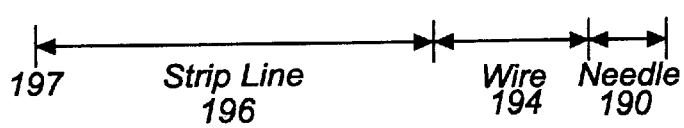
Fig. 4C
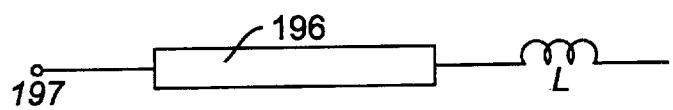
Fig. 4D
Fig. 4E
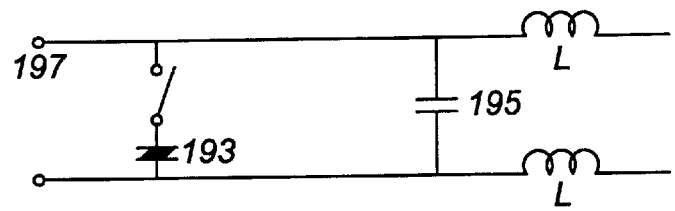

US 6,399,900 B1

CONTACT STRUCTURE FORMED OVER A GROOVE

FIELD OF THE INVENTION

This invention relates to contact structures to establish electrical contact with contact targets such as contact pads or leads of electronic circuits or devices, and more particularly, to contact structures to be used in a probe card to test semiconductor wafers, semiconductor chips, packaged semiconductor devices or printed circuit boards and the like with an improved frequency bandwidth, pin pitch and contact performance and reliability.

BACKGROUND OF THE INVENTION

In testing high density and high speed electrical devices such as LSI and VLSI circuits, high performance contact structures, such as probe contactors or test contactors, must be used. The contact structure of the present invention is not limited to the application of testing and burn-in of semiconductor wafers and die, but is inclusive of testing and burn-in of packaged semiconductor devices, printed circuit boards and the like. The contact structure of the present invention can also be used in more general applications including an IC lead, IC packaging, and other electrical connections. However, for the convenience of explanation, the present invention is described mainly with reference to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables. The test head and the substrate handler 400 are mechanically as well as electrically connected with one another by means of a manipulator 500 and a drive motor 510. The semiconductor wafers to be tested are automatically provided to a test position of the test head by the substrate handler.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

In FIG. 1, the test head 100 and the substrate handler 400 are connected through an interface component 140 consisting of a performance board 120 which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps (contact targets) on the wafer 300. The ends of the cantilevers 190 are connected to wires 194 which are further connected to transmission lines (not shown) formed in the probe card 170. The transmission lines are connected to a plurality of electrodes 197 which further contact the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transitional state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, the strip (impedance matched) line 196, the wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu F$ and can be disconnected from the power lines by switches if necessary. The capacitors 195 have a relatively small capacitance value such as 0.01 $\mu F$ and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth.

SUMMARY OF THE INVENTION

Therefore, it is an object of the present invention to provide a contact structure for electrically contacting with a contact target which is capable of achieving a high frequency bandwidth, high pin counts and high contact performance as well as high reliability.

It is another object of the present invention to provide a contact structure such as a probe contactor to establish electrical connection in applications such as testing semiconductor devices and the like, having a very high frequency bandwidth to meet the test requirements in the next generation semiconductor technology.

It is a further object of the present invention to provide a contact structure to establish electrical connection in applications such as testing semiconductor devices, which are suitable for testing a large number of semiconductor devices in parallel at the same time.

It is a further object of the present invention to a contact structure to establish electrical connection in testing semiconductor devices, which are produced through a semiconductor production process without involving manual assembly or handling, thereby achieving consistent quality.

It is a further object of the present invention to provide a contact structure for establishing electrical connection in testing semiconductor devices which are produced through a micromachining process.

It is a further object of the present invention to provide contact structures to be mounted on a probe card for testing semiconductor devices which are capable of compensating temperature expansion coefficient of a semiconductor wafer under test.

In the present invention, a contact structure for establishing an electrical connection with a contact target is formed by a substrate of a planar surface on which a contactor is created by a microfabrication process established in the semiconductor technology.

The contact structure of the present invention is comprised of a substrate such as a silicon substrate and a contactor formed on the substrate through a micromachining process in which the contactor has a horizontal portion and a contact portion vertically formed on one end of the horizontal portion, wherein the horizontal portion of the contactor produces a contact force when the contactor is pressed against said contact target.

The contact structure further includes an interconnect trace on the substrate, one end of which is connected to the contactor while the other end is used for electrically connecting said contactor to an outer component. The contactor is made of metal and formed through a deposition process performed on a deposition area which has been directly formed by an electro-thermal energy generated by a micromachining tool. The contactor further comprises a base portion between the substrate and the horizontal portion where the base portion supports the horizontal portion and contact portion of the contactor.

Another aspect of the present invention is a contact structure having a recess. The contact structure includes a dielectric substrate having a recess (groove) on a surface thereof and a contactor formed on the substrate through a microfabrication process. The contactor is comprised of a horizontal portion having a fixed end and a free end, and a contact portion mounted on the free end of the horizontal portion. The fixed end is connected to the substrate and the free end is positioned over the recess on the substrate. The horizontal portion of the contactor produces a contact force when the contactor is pressed against the contact target such that the free end of the horizonal portion goes in the recess to exert a contact force.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

BRIEF DESCRIPTION OF THE DRAWINGS

FIG. 3 is a bottom view showing an example of the probe card having an epoxy ring for mounting a plurality of probe contactors (needles or cantilevers) in the conventional technology.

FIGS. 4A–4E are circuit diagrams showing equivalent circuits of the probe card of FIG. 3.

DETAILED DESCRIPTION OF THE PREFERRED EMBODIMENT

Figure 1:
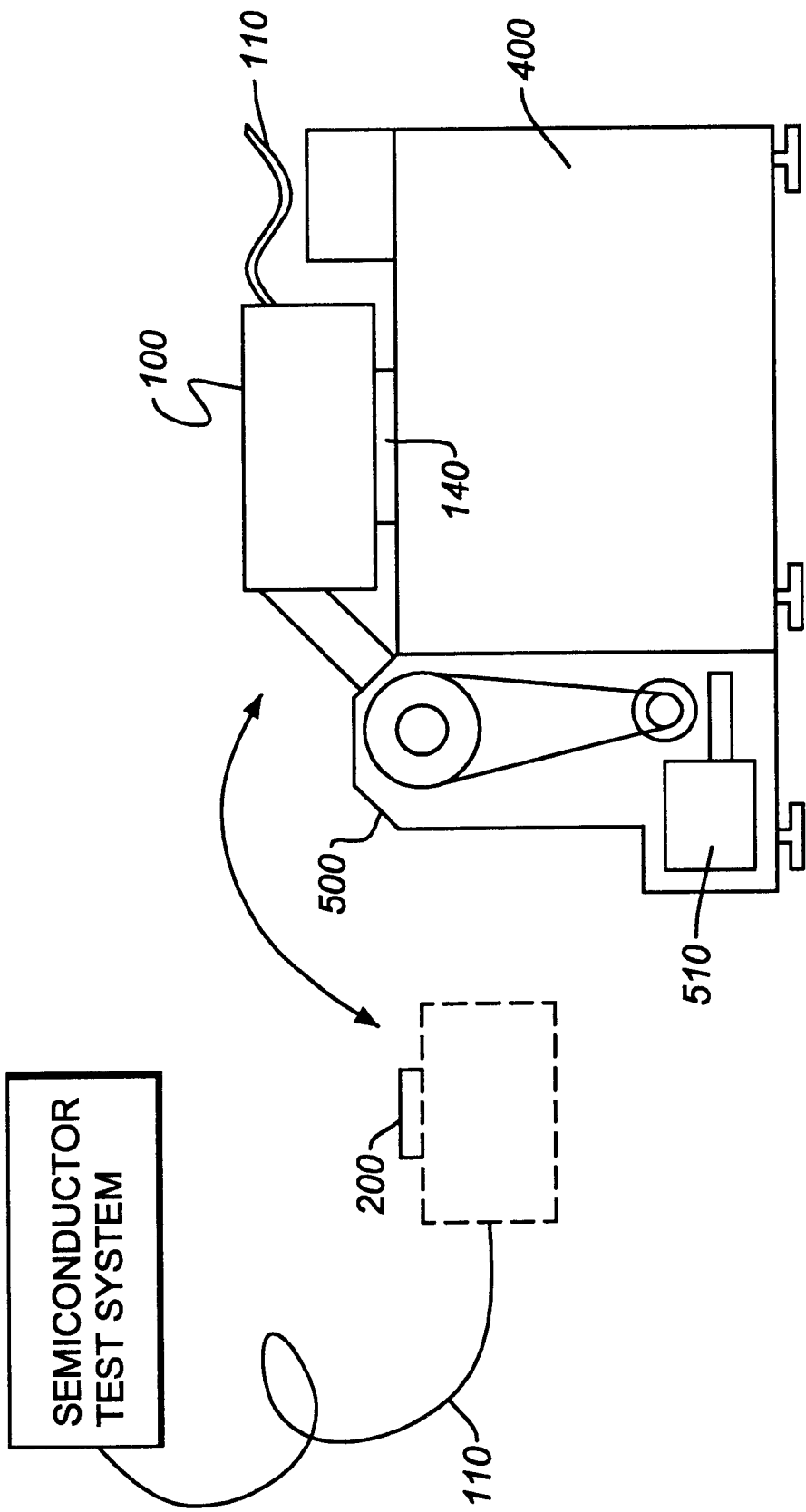
FIG. 1 is a schematic diagram showing a structural relationship between a substrate handler and a semiconductor test system having a test head.
Figure 2:
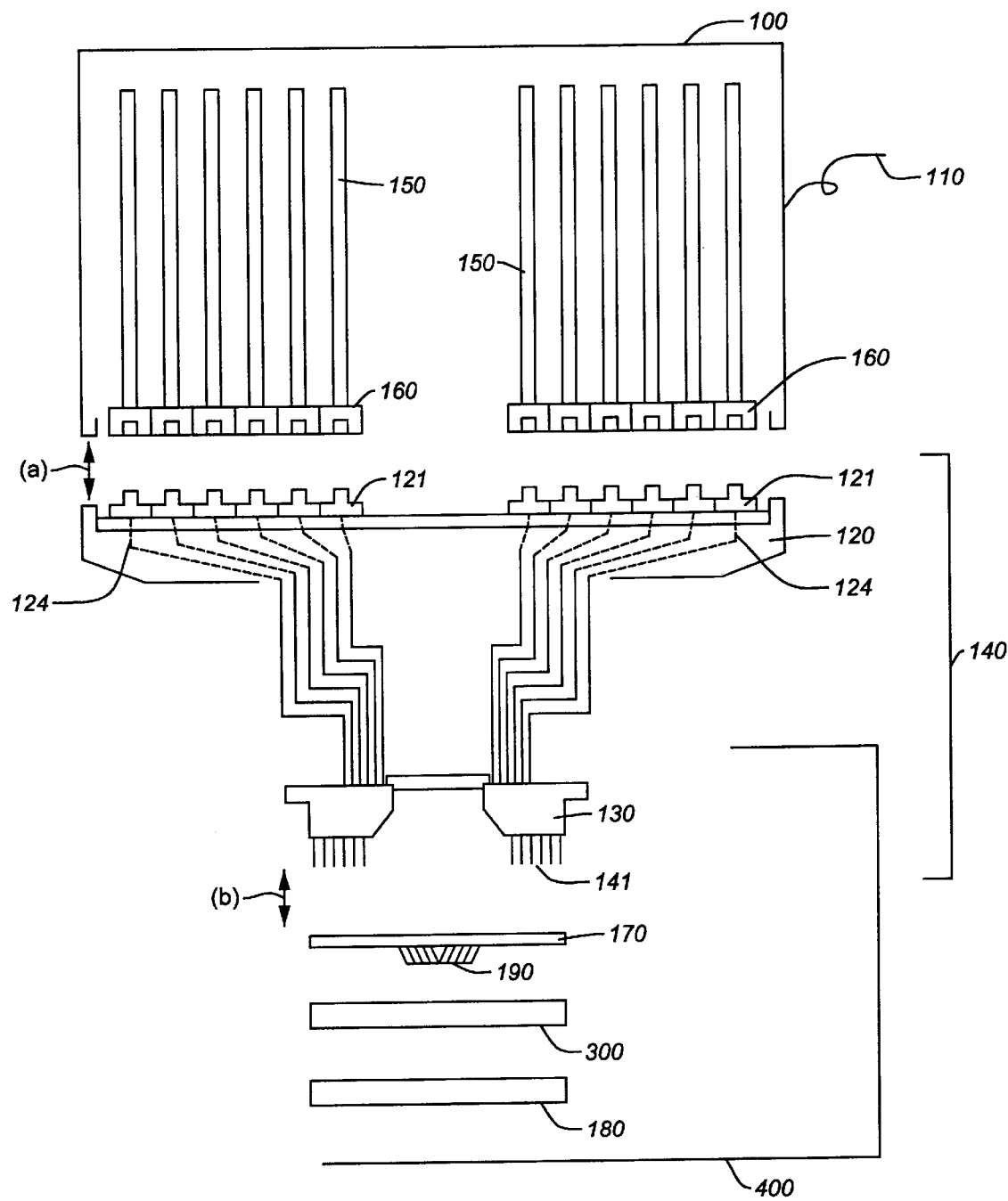
FIG. 2 is a diagram showing an example of a more detailed structure for connecting the test head of the semiconductor test system to the substrate handler through an interface component.
Figure 5:
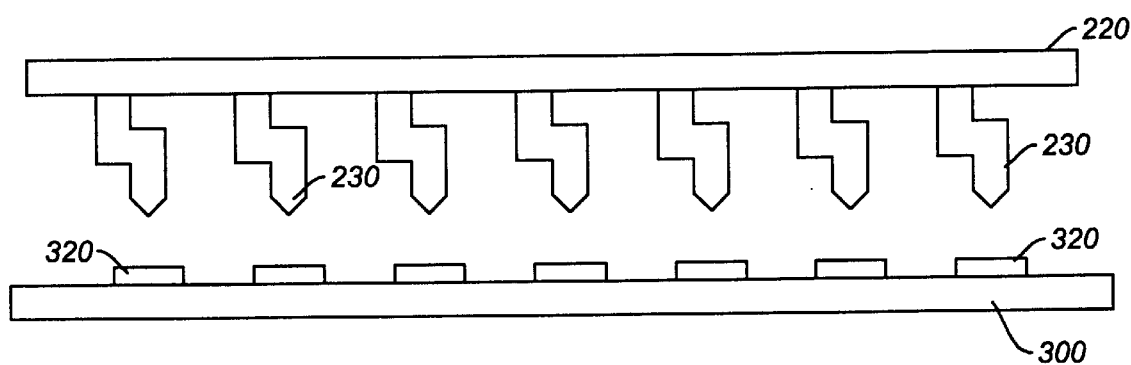
FIG. 5 is a schematic diagram showing contact structures of the present invention produced through a microfabrication process.
Figure 6A:
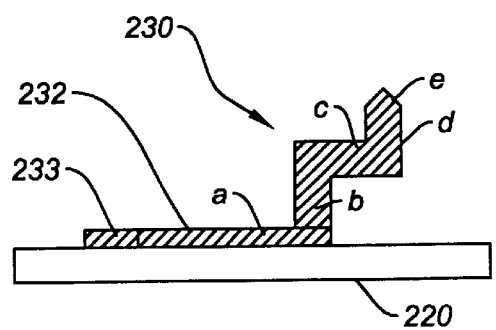
FIGS. 6A–6C are schematic diagrams showing examples of structure of the contact structure of the present invention formed on a substrate.
Figure 6B:
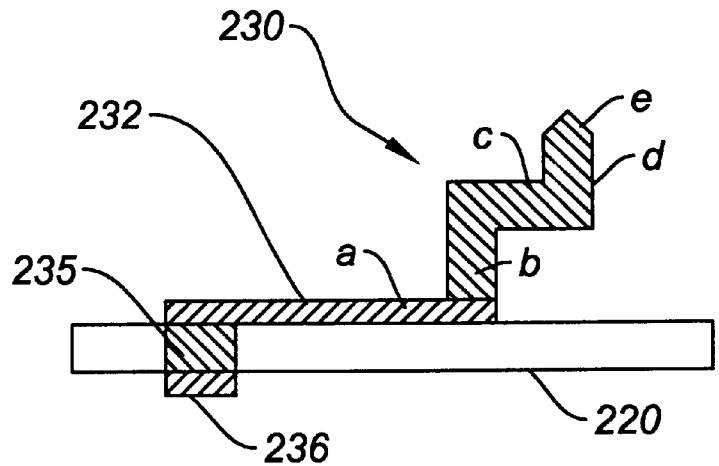
Figure 6C:
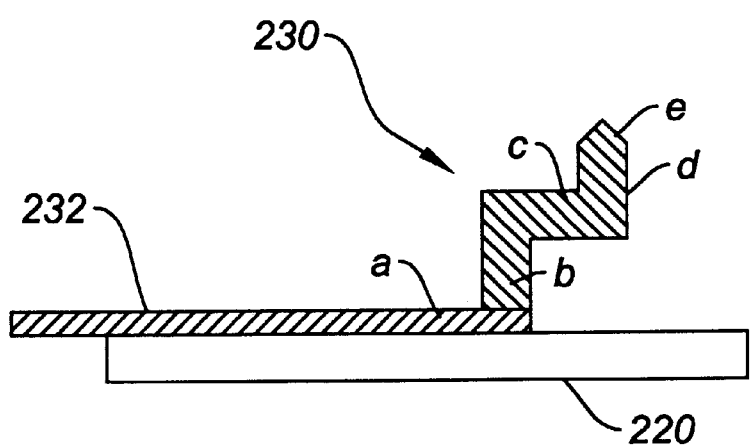
Figure 7A:
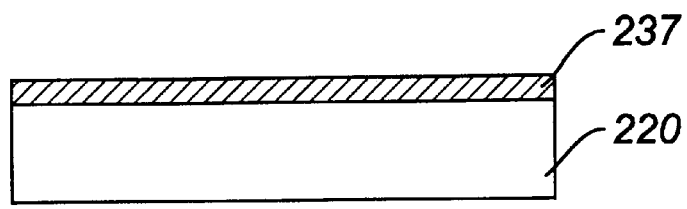
FIGS. 7A–7P are schematic diagrams showing an example of process for forming the contact structure of the present invention.
Figure 7B:
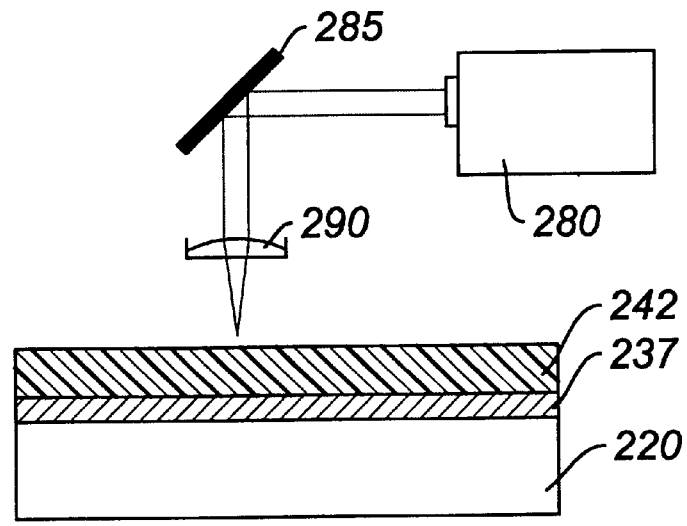
Figure 7C:
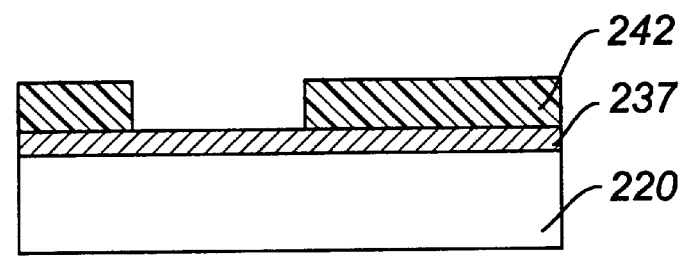
Figure 7D:
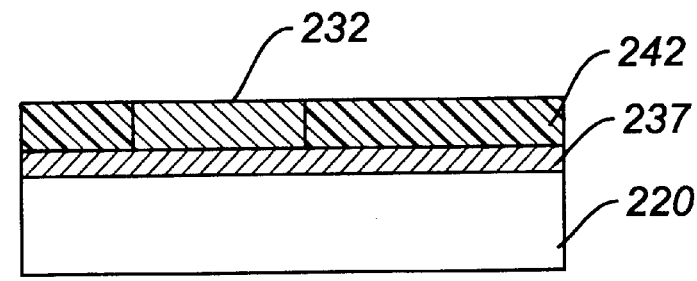
Figure 7E:
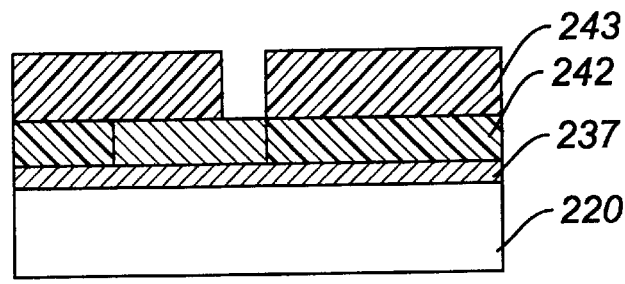
Figure 7F:
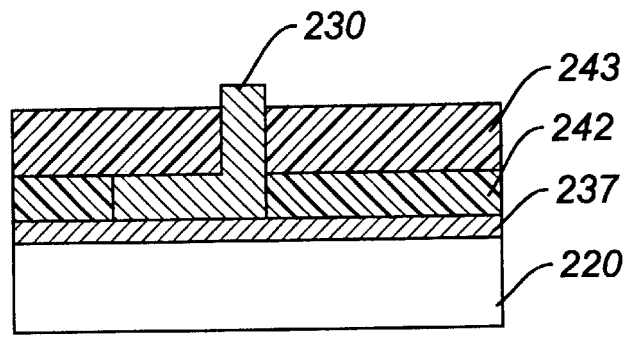
Figure 7G:
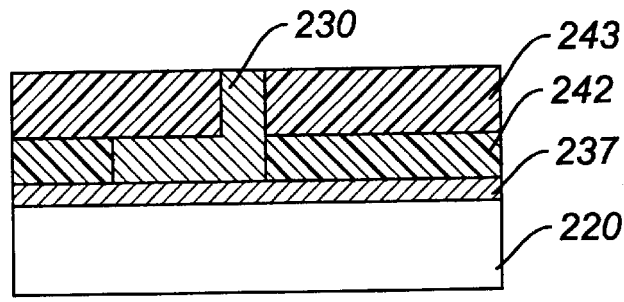
Figure 7H:
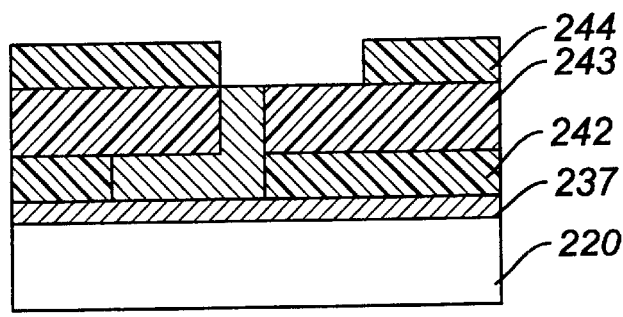
Figure 7I:
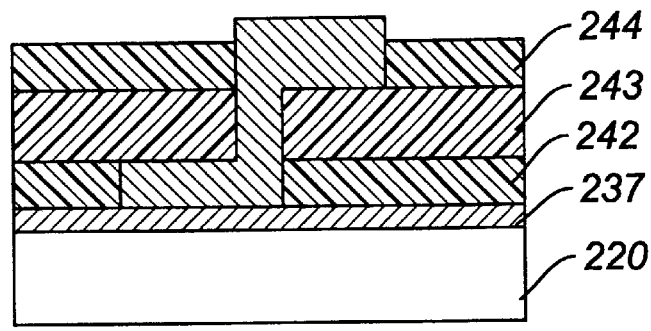
Figure 7J:
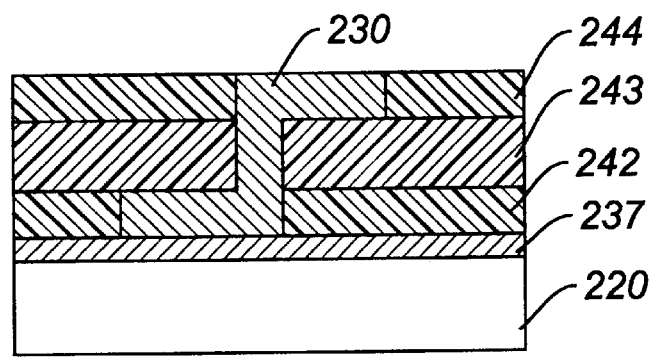
Figure 7K:
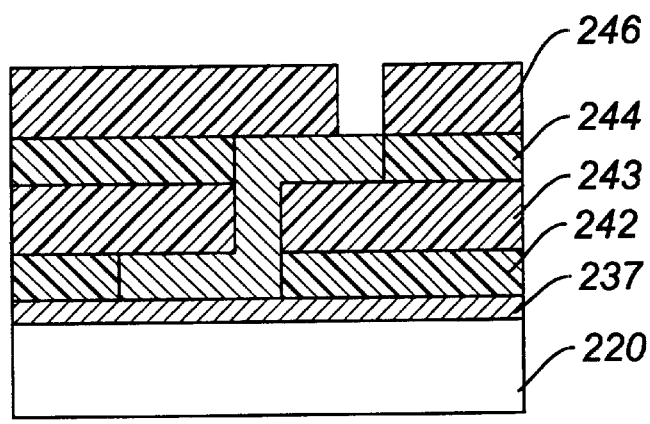
Figure 7L:
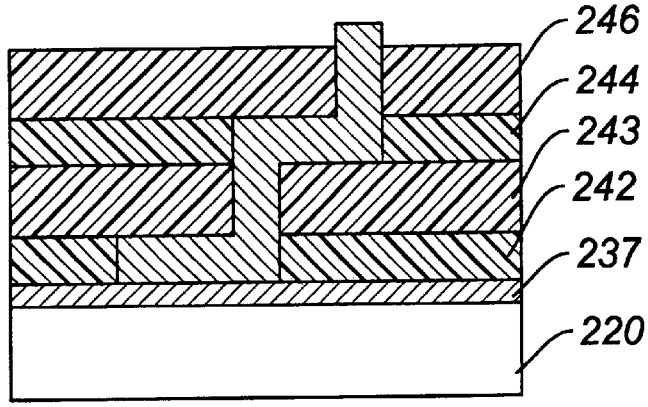
Figure 7M:
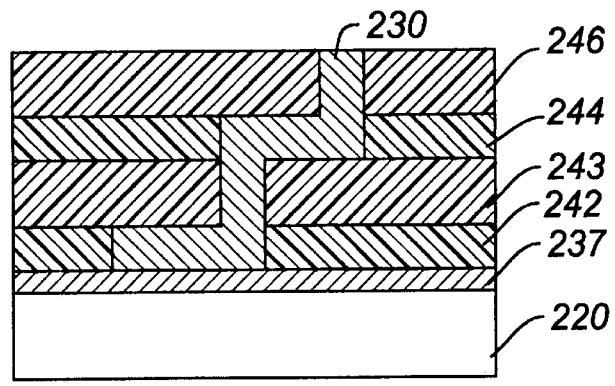
Figure 7N:
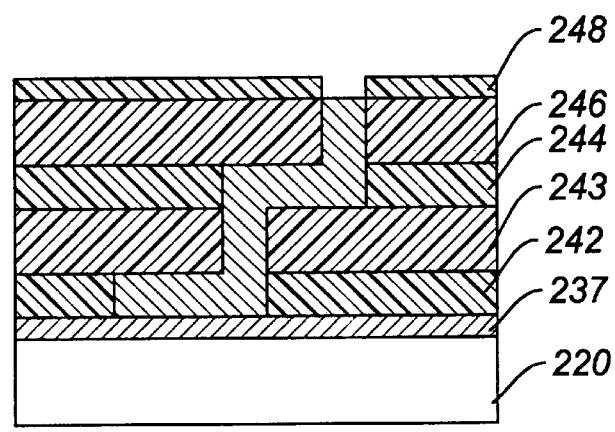
Figure 7O:
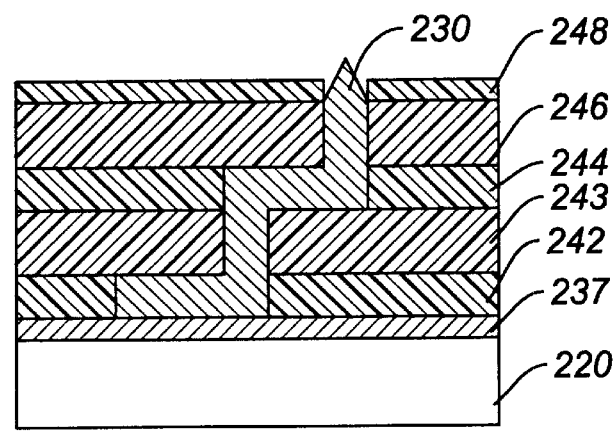
Figure 7P:
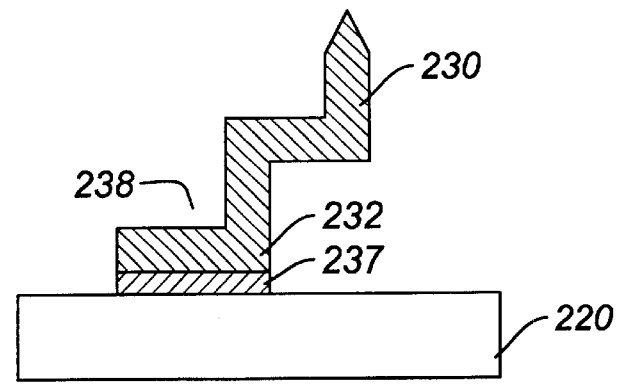
Figure 8A:
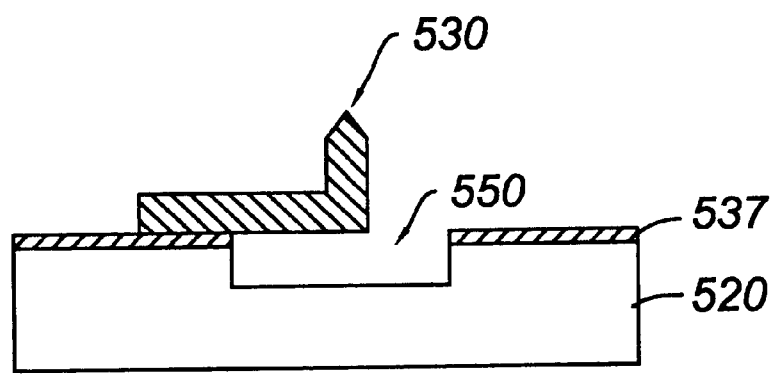
FIGS. 8A and 8B are schematic diagrams showing further examples of contact structures formed on substrates according to the present invention.
Figure 8B:
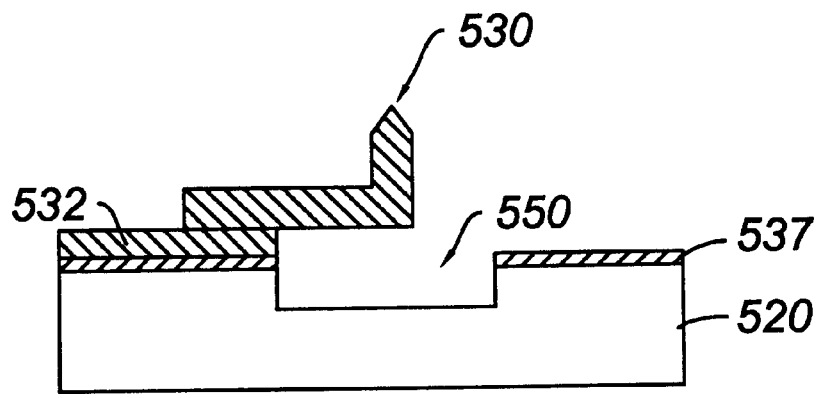

The first example of the contact structure of the present invention is shown in FIGS. 5–7, and the second example of the contact structure of the present invention is shown in FIGS. 8A and 8B. The production process of the first example of the contact structure is shown in FIGS. 7A–7P and the production process of the second example of the contact structure is shown in FIGS. 9A–9J.

With respect to the first example, FIG. 5 shows a contact structure having a plurality of contactors 230 formed on a substrate 220 which is typically a silicon substrate. Other materials such as glass fiber, ceramic, alumina or other dielectric materials are also feasible for the substrate. All of the contactors 230 are produced through the same production processes on the silicon substrate 220. Such a semiconductor production process includes a photolithography process, a micro-machining process, a mold process (hot embossing), and the like.

When the semiconductor wafer 300 under test moves upward, the contactors 230 contact corresponding contact targets (electrodes or contact pads) 320 on the wafer 300 to be tested. The pitch between the contact pads 320 may be as small as 50 µm or less. The contactors 230 of the present invention can easily be aligned in the same pitch since the contactors are made by the same semiconductor production process as the wafer 300 are made.

The contactors 230 on the silicon substrate 220 can be directly mounted on a probe card such as shown in FIG. 3, or molded in a package, such as a traditional IC package having leads, so that the package is mounted on a probe card. Since the contactors 230 can be fabricated in a very small size, a frequency bandwidth of a probe card mounting the contactors of the present invention can be easily increased to 2 GHz or higher. Because of the small size, the number of contactors on a probe card can be increased to, for example 2,000, which is able to test as many as 32 or more memory devices in parallel at the same time.

Furthermore, because the contactors 230 of the present invention are formed on the silicon substrate 220, environmental changes such as a temperature expansion ratio of the silicon substrate are the same as those of the semiconductor wafer 300 under test. Therefore, the accurate positioning between the contactors 230 and the pads 320 can be maintained throughout the test.

FIGS. 6A–6C provide more detailed views of the contact structure having the contactor 230 on the silicon substrate 220. To establish an interconnection with the probe card or the IC package as noted above, the examples of FIGS. 6A–6C show basic three types of electrical path to form such interconnections. FIG. 6A shows an example in which such an electrical connection is established at the top of the substrate. FIG. 6B shows an example in which an electrical connection is established at the bottom of the substrate while FIG. 6c shows an example in which an electrical connection is formed at the edge of the substrate. Almost any types of existing IC package design or probe card design can accommodate at least one of the interconnect types of FIGS. 6A–6C.

The example of FIG. 6A includes an interconnect trace 232 also designated by a and an interconnect pad 233 on the substrate 220. The interconnect trace 232 establishes an electric path from the contactor 230 to the interconnect pad 233. The example of FIG. 6B includes an interconnect trace 232, an interconnect pad 235 via the substrate 220 and an interconnect pad 236 at the bottom of the substrate 220. In the example of FIG. 6C, the interconnect trace 232 extends to the edge of the substrate 220. In each of the examples, the interconnect trace 232 also functions to fan-out the small pitch of the contactors 230 to a larger pitch to fit to the probe card or IC package.

As shown in each of FIGS. 6A–6C, the contactor 230 has vertical portions b and d and a horizontal beam c and a tip portion e. The tip portion e of the contactor 230 is preferably sharpened to achieve a scrubbing effect when pressed against the contact target 320 requiring penetration through a metal-oxide layer. For example, if the contact target 320 on the wafer 300 has aluminum oxide on its surface, the scrubbing effect is necessary to establish the electric contact with low contact resistance. The spring force of the horizontal beam c provides an appropriate contact force against the contact pad 320. The elasticity produced by the spring force of the horizontal beam c also functions to compensate the differences in size or the fluctuation of flatness involved in the contactors 230, the silicon substrate 220, the contact pad 320 and the semiconductor wafer 300.

An example of material of the contactor 230 includes nickel, aluminum and copper. The tip portion e may be plated by nickel palladium, rhodium, nickel gold, iridium or several other depositable materials. An example of size of the contactor intended for a probe-test application may be 100–400 µm in overall height, 50–400 µm in horizontal length, and about 30–60 µm in thickness for the pitch of 50 µm between contact targets 320.

FIGS. 7A–7P show an example of process for producing the contact structure of the present invention through a micromachining technology. In FIG. 7A, a thin metal layer 237 made of copper, for example, is provided on the silicon substrate 220. The metal layer 237 is a seed layer to achieve electrical conductivity for forming the interconnect trace 232. and contactor 230 of FIG. 6 through an electroplating process. If the interconnect trace 232 and contactor 230 are formed through other deposition process such as sputtering, the seed layer 237 unnecessary. Although such an electroplating process is repeated several times in the example of FIGS. 7A–7P and the similar conductive layers are also used, no more such metal layers are shown in the following for simplicity of explanation.

An abrasive layer 242 is formed on the metal layer 237 over which a micromachining tool is provided to directly form a plating pattern on the abrasive layer 242. An example of material for the abrasive layer 242 is epoxy or polyimide although many other materials are also feasible. Such a micromachining tool includes an electron beam machining tool, a laser beam machining tool, a plasma beam machining tool or other tools. In the example of FIG. 7B, a laser beam source 280 is used to apply a laser beam to the abrasive layer 242 through a mirror 285 and a lens 290. An example of the laser source 280 includes an excimer laser, a carbon dioxide ($CO_2$) laser and an ND:YAG laser.

A plating pattern is formed on the abrasive layer 242 by an electro-thermal energy of the laser beam as shown in FIG. 7C. An electroplating is performed on the pattern formed by the laser beam micromachining tool in FIG. 7D, creating the interconnect trace 232 which is a portion a shown in FIGS. 6A–6C. An example of the conductive material for the interconnect trace 232 as well as the contactor 230 in the following plating processes includes nickel, aluminum and copper. In the next step shown in FIG. 7E, another abrasive layer 243 is formed on the layer 242. The laser beam is applied to the abrasive layer 243 to form a base portion of the contactor 230. Thus, by applying the plating process, the base beam of the contactor 230 which is a portion b shown in FIGS. 6A–6C is created as shown in FIG. 7F. The overplated portion in FIG. 7F is removed in the grinding (planarizing) process as shown in FIG. 7G.

A further abrasion process is conducted to form a horizontal beam of the contactor 230. In FIG. 7H, the production process further forms an abrasive layer 244 on the layer 243. The laser trimming process is performed on the abrasive layer 244 so that a pattern for the horizontal beam c is created as shown in FIG. 7H. Another electroplating is performed on the pattern so that the horizontal beam shown in FIG. 7I is created. The overplated portion in FIG. 7I is removed in the process of FIG. 7G.

To produce another vertical portion of the contactor 230, an abrasive layer 246 is provided on the layer 244 in FIG. 7K. By the operation of the laser beam machining tool, a pattern for the vertical beam is formed in FIG. 7K. The vertical beam portion d of FIGS. 6A–6C is formed at an end of the horizontal beam as shown in FIG. 7L. Again, the overplated portion in FIG. 7L is removed in the process of FIG. 7M. FIGS. 7N and 7O show a process of forming a tip e of the contactor 230 by the similar laser trimming and electroplating procedures in the foregoing. The material for the tip portion e includes nickel palladium, rhodium, nickel gold, iridium or several other depositable conductive materials.

In FIG. 7P, the abrasive layers 242, 243, 244, 246 and 248 are stripped off with use of a special solvent. An etching process may be conducted to remove the seed layers such as the thin metal layer 237. As in the foregoing, the contactor 230 and the interconnect trace 232 are formed on the silicon substrate 220 by the micromachining technology such as a laser beam machining tool.

FIGS. 8A and 8B show the second example of the contact structure of the present invention. In this example, the contact structure has a contactor 530 whose structure is simpler than that of the first example in the foregoing. The contactor 530 is formed on a substrate 520 which is typically a silicon substrate or a dielectric substrate. The contactor 530 is formed of a horizontal beam and a vertical beam where the horizontal beam exerts a spring force when the contactor is pressed against a contact target. A recess 550 is provided on the substrate 520. The recess 550 is positioned under the vertical beam to provide a free space for the contact structure to enter therein to exert a contact force when pressed downward in FIGS. 8A and 8B.

In the example of FIG. 8B, an interconnect trace 532 connected to the contactor 530 is also shown to establish interconnection with outer components such as a printed circuit board or a package (not shown). Such an interconnection may be directly made between the outer components and the contactor 530 in the example of FIG. 8A. A thin metal layer 537 is shown in FIGS. 8A and 8B which functions as a seed layer for an electroplating process for forming the contactor 530 as will be described later.

In the contact structure of the second example, similar to the example of FIG. 5, a plurality of contactors 530 may be formed on a common substrate 520. All of the contactors 530 are produced at the same time through the same production processes on the silicon substrate 520. Such a production process includes a photolithography process, a micro-machining process, a mold process (hot embossing), and the like.

The contactors 530 on the silicon substrate 520 can be directly mounted on a probe card such as shown in FIG. 3, or molded in a package, such as a traditional IC package having leads, so that the package is mounted on a probe card. Since the contactors 530 can be fabricated in a very small size, a frequency bandwidth of a probe card mounting the contact structures of the present invention can be easily increased to 2 GHz or higher. Because of the small size, the number of contactors on a probe card can be increased to, for example 2,000, thereby being able to test as many as 32 or more memory devices in parallel at the same time.

Furthermore, because the contactors 530 of the present invention are formed on the silicon substrate 520, variations caused by environmental changes such as a temperature expansion ratio of the silicon substrate 520 of the contact structure are the same as those of the semiconductor wafer 300 under test. Therefore, the accurate positioning between the contactors 530 and the contact pads on the wafer 300 can be maintained throughout the test.

An example of material of the contactor 530 includes nickel, aluminum and copper. The tip portion of the contactor 530 may be plated by nickel palladium, rhodium, nickel gold, iridium or several other depositable materials. An example of size of the contactor 530 intended for a probe-test application may be 50–200 $\mu$m in overall height, 50–400 $\mu$m in horizontal length, and about 30–60 $\mu$m in thickness for the pitch of 50 $\mu$m between contact targets.

FIGS. 9A–9J show an example of process for producing the contact structure of the present invention through the microfabrication technology. In the following, the production process is explained based on a photolithography process although other processes such as a micromachining process described with reference to FIGS. 7A–7OP are also applicable.

Figure 9A:
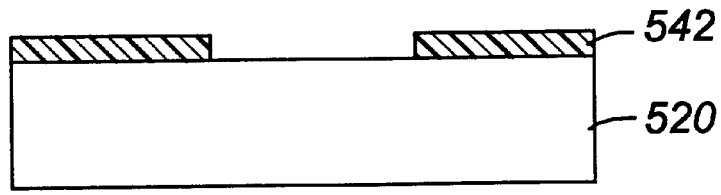
FIGS. 9A–9J are schematic diagrams showing an example of production process for forming the contact structure of the present invention shown in FIG. 8A.

In FIG. 9A, a photoresist layer 542 is formed on the substrate 520 by a photolithography process. Such a photolithography process includes the steps of photoresist coating, masking, exposure, and photoresist stripping as is well known in the art. Although not shown, a photo mask is aligned over the photoresist layer 542 so that the photoresist layer 542 is exposed with ultraviolet light based on the pattern printed on the photo mask. If a positive acting photoresist is used, the photoresist covered by the opaque portions of the photo mask harden (cure) after the exposure. The exposed part of the resist can be dissolved and washed away, leaving a photo mask layer 542 of FIG. 9A which defines an etching area.

Figure 9B:
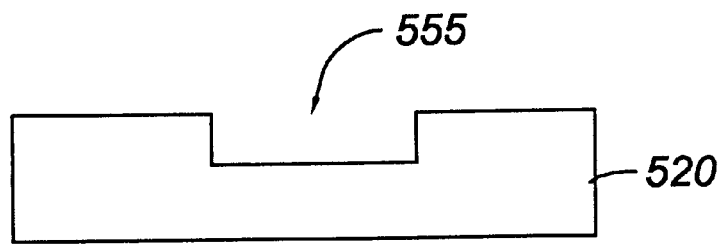
Figure 9C:
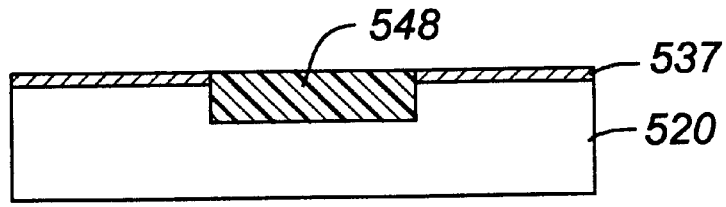

Through an etching process, an indented (groove) portion 555 is created on the substrate 520 as shown in FIG. 9B. The photoresist layer 542 in FIG. 9A is removed with use of a dissolution solvent. In FIG. 9C, a sacrificial part 548 is formed in the indented portion on the substrate 520. The sacrificial part 548 is made, for example, of silicon dioxide ($SiO_2$) through a deposition process such as chemical vapor deposition (CVD). A thin metal layer 537 is formed on the substrate to function as a plating seed layer.

Figure 9D:
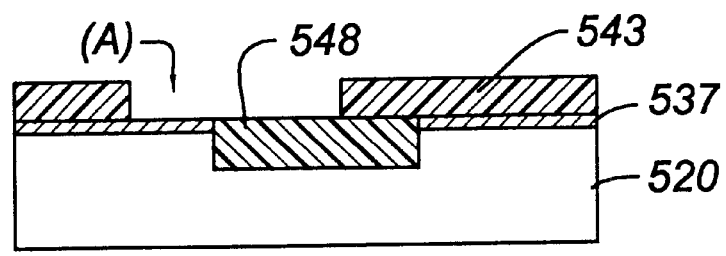
Figure 9E:
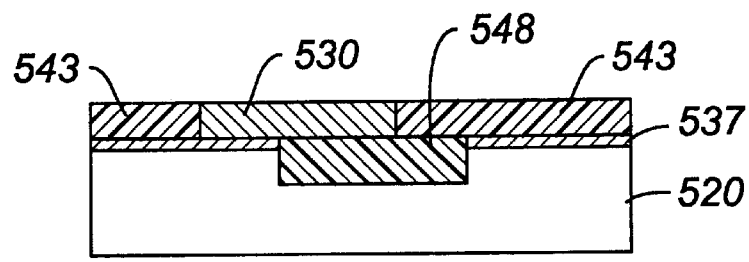

In FIG. 9D, a photoresist layer 543 is formed on the substrate through a photolithography process in the same manner described above. Thus, a deposition area (A) is defined in the photoresist layer 543. In FIG. 9E, the horizontal beam of the contactor 530 is created by plating electroplating conductive material in the defined area (A). An example of conductive material includes copper, nickel, aluminum or other metal.

Figure 9F:
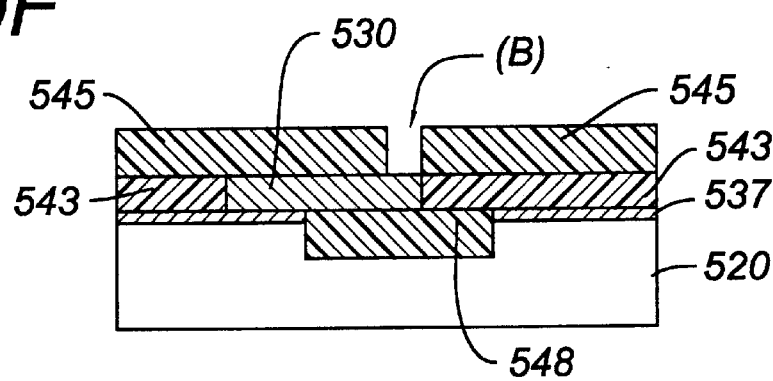
Figure 9G:
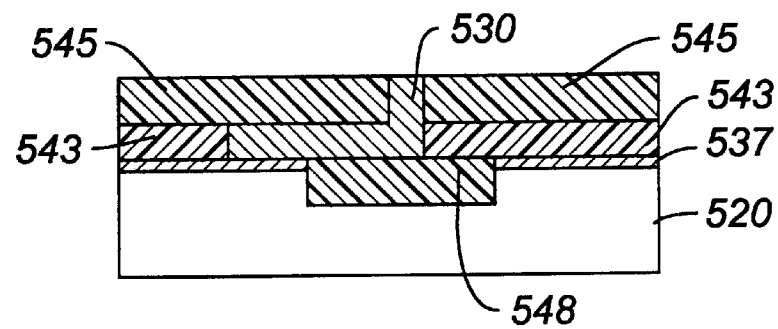

The foregoing process is repeated for producing the Vertical beam of the contactor 530. In FIG. 9F, a photoresist layer 545 is formed on the substrate through a photolithography process in the same manner described above. Thus, a deposition area (B) is defined in the photoresist layer 545. In FIG. 9G, the vertical beam of the contactor 530 is created by electroplating the above noted conductive material in the defined area (B).

Figure 9H:
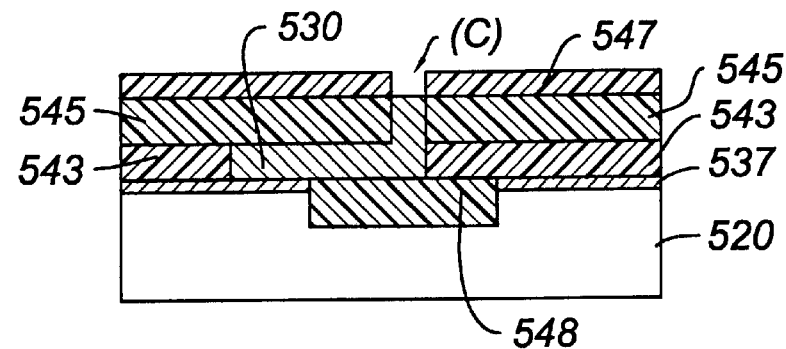
Figure 9I:
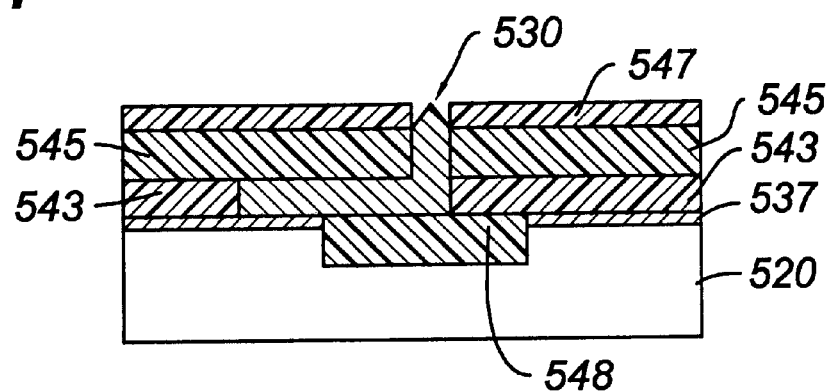

The tip portion of the contactor 530 is formed by the same process in the foregoing. In FIG. 9H, a photoresist layer 547 is formed on the substrate through a photolithography process in the same manner described above. Thus, a deposition area (C) is defined in the photoresist layer 547. In FIG. 9I, the tip portion of the contactor 530 is created by electroplating the conductive material in the defined area (C). The material for the tip portion preferably includes nickel palladium, rhodium, nickel gold, and iridium, although the same conductive material used for the horizontal and vertical beams are also feasible.

Figure 9J:
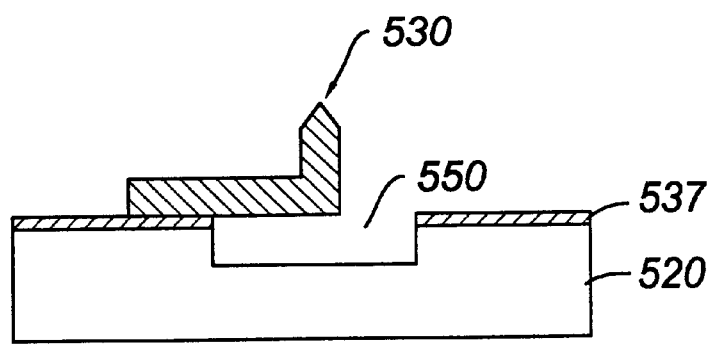

In FIG. 9J, the photoresist layers 543, 545, 547 and the sacrificial part 548 are stripped off with use of a special solvent. As in the foregoing, the contactor 530 having horizontal beam and the vertical beam are formed on the silicon substrate 520 by the photolithography technology. In the contact structure of FIG. 9J, the recess 550 on the substrate 520 allows the contactor 530 to enter therein when the contactor is pressed downward to exert the contact force against the contact target.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for achieving an electrical connection with a contact target, comprising:

a substrate having a planar surface;

a groove formed on said substrate in such a way that an open space of said groove is created lower than said planar surface; and a contactor formed on said substrate, said contactor being comprised of a horizontal portion which is a substantially straight beam having a fixed end and a free end and a contact portion mounted on the free end of said horizontal portion in a direction perpendicular to the horizontal portion, said fixed end being connected to said substrate and said free end being positioned over said groove on said substrate;

wherein said groove provides a free space for said contactor for entrance of said free end of said horizonal portion when said contactor is pressed against said contact target.

2. A contact structure as defined in claim 1, wherein said contactor is formed on said substrate through a photolithography process or a micromachining process.

3. A contact structure as defined in claim 1, wherein said contactor is made of conductive material.

4. A contact structure as defined in claim 1, wherein said contactor is formed on said substrate by repeating a plurality of photolithography processes, each of said photolithography processes including steps of photoresist coating, masking, exposure, photoresist stripping and conductive material deposition.

5. A contact structure as defined in claim 1, wherein said substrate is a dielectric substrate.

6. A contact structure as defined in claim 1, wherein said substrate is a silicon substrate.

7. A method of producing a contact structure having a contactor for achieving an electrical connection with a contact target, comprising the steps of:

providing a substrate having a planar surface thereon;

forming a groove on the substrate in such a way that an open space of the groove is positioned lower than the planar surface of the substrate;

forming a sacrificial part by filling sacrificial material in the groove;

forming a photoresist layer on the planar surface of the substrate and on the sacrificial part;

positioning a photomask over the photoresist layer, the photomask having a pattern representing at least a part of the contactor;

exposing the photoresist layer with light and removing uncured parts of the photoresist to form a plating pattern on the photoresist layer transferred from the photomask;

electroplating the plating pattern on the photoresist layer to form the contactor;

repeating the above procedure for forming a remaining part of the contactor;

removing one or more photoresist layers from the substrate; and removing the sacrificial part by removing the sacrificial material from the groove;

wherein the contactor is comprised of a horizontal portion which is a substantially straight beam having a fixed end and a free end and a contact portion mounted on the free end of the horizontal portion in a direction perpendicular to the horizontal portion, the fixed end being connected to the substrate and the free end being positioned over said groove on said substrate; and wherein said groove provides a free space for the contactor for entrance of said free end of said horizonal portion when said contactor is pressed against said contact target.

8. A method of producing a contact structure as defined in claim 7, the substrate is a dielectric substrate or a silicon substrate.

9. A method of producing a contact structure as defined in claim 7, wherein the contactor is made of conductive metal formed by the electroplating step.

10. A method of producing a contact structure as defined in claim 7, wherein the sacrificial material on the substrate is made of silicon dioxide and is removed from the substrate after forming the contactor to create the groove below the contactor.

* * * * *